United States Patent
Chang et al.

(10) Patent No.: US 6,320,786 B1
(45) Date of Patent: Nov. 20, 2001

(54) METHOD OF CONTROLLING MULTI-STATE NROM

(75) Inventors: Yao Wen Chang, Hsinchu; Wen Jer Tsai, Hualian; Tao Cheng Lu, Koashiung, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/777,229

(22) Filed: Feb. 5, 2001

(30) Foreign Application Priority Data

Dec. 22, 2000 (TW) .................................................. 89127627

(51) Int. Cl.[7] .................................................. G11C 16/04
(52) U.S. Cl. .................. 365/185.03; 365/189.01
(58) Field of Search ...................... 365/185.03, 185.23, 365/185.24, 189.01

(56) References Cited

U.S. PATENT DOCUMENTS 6,154,390 * 11/2000 Yang .................................. 365/185.21
6,191,677 * 2/2001 Lee .................................. 365/185.21
6,259,627 * 7/2001 Wong .................................. 365/185.03

* cited by examiner

Primary Examiner—Vu A. Le
(74) Attorney, Agent, or Firm—Jiawei Huang; J.C. Patents

(57) ABSTRACT

A method of controlling the multi-state NROM. A program is executed to inject electric charges that are trapped inside a nitride layer of the NROM. The amount of electric charges trapped inside the nitride layer is controlled so that the memory cell can have different threshold voltages. To read from the memory cell, a first variable voltage is applied to the gate electrode. According to the range of a second variable voltage applied to the drain terminal, three different potential levels, from the smallest to the largest, including a first potential level, a second potential level and a third potential level are set. The second input voltage is adjusted to the first potential level. When a high current is sensed, a first storage state is assumed. If little current is detected, the second input voltage is adjusted to the second potential level. When a high current is sensed, a second storage state is assumed. On the other hand, if little current is detected, the second input voltage is adjusted to the third potential level. Similarly, if a high current is sensed, a third storage state is assumed. Conversely, when little current is detected, a fourth storage state is assumed.

4 Claims, 4 Drawing Sheets

METHOD OF CONTROLLING MULTI-STATE NROM

CROSS-REFERENCE TO RELATED APPLICATION

This application claims the priority benefit of Taiwan application serial no. 89127627, filed Dec. 22, 2000.

BACKGROUND OF THE INVENTION

1. Field of Invention

The present invention relates to a method of using an NROM. More particularly, the present invention relates to a method of controlling a multi-state NROM.

2. Description of Related Art

FIG. 1 is a schematic cross-sectional view of a conventional flash memory cell. As shown in FIG. 1, the flash memory cell includes a gate electrode that consists of a floating gate 12 and a control gate 14. The floating gate 12 is a polysilicon layer for holding electric charges. The floating gate 12 is always in a 'floating' state because the gate 12 is disconnected from external circuits. The control gate 14 is used for controlling data access. Each memory cell is capable of holding a single bit. In other words, each memory cell can only distinguish between logic states '0' and '1'. FIG. 2 is a simple graph showing the conventional method of distinguishing between logic '1' and '0' in a memory cell. As shown in FIG. 2, a voltage Vread is applied to the gate when data access is required. If the threshold voltage of the memory cell is smaller than Vread (for example, Vt1), a large current is sensed implying a logic state '1'. On the other hand, if the threshold voltage of the memory cell is greater than Vread (for example, Vt2), very small current is detected implying a logic state '0'.

Following the introduction of high-density flash memory, memory capable of distinguishing a multiple of state is developed. FIG. 3 is a graph showing a conventional method of distinguishing four different states in a memory cell (including '00', '01', '10' and '11'). As shown in FIG. 3, three standard reading voltages Vr1, Vr2 and Vr3 are set to distinguish between four different types of threshold voltages (Vt1, Vt2, Vt3 and Vt4). However, threshold voltage region cannot be made very large because Fowler-Nordeim (F-N) tunneling current is easily affected by any deviation in the processing parameters such as the variation of tunneling oxide thickness and the variation of tunneling junction area. The deviation of such F-N tunneling current often affects the size of threshold voltage region for accessing data inside a memory cell array. Together with dimensional limitations of a chip, most flash memory cell can only support two storage states. Hence, a higher memory storage capacity is difficult to attain.

On the other hand, an NROM memory cell is able to hold a data bit in the drain terminal and the source terminal. However, the drain terminal and the source terminal need to be connected in reverse during programming and reading, leading to the need for quite complicated control circuits. Moreover, if a neighboring bit undergoes some programming when current is being measured, the so-called second-bit effect may occur leading to a considerable reduction of the original high current. In addition, since both terminals are employed to hold data, scaling down is made more difficult.

SUMMARY OF THE INVENTION

Accordingly, one object of the present invention is to provide a method of controlling a multi-state NROM that utilizes a non-symmetrical charge trapping characteristic and different drain voltages $V_D$ to distinguish between differently programmed threshold voltage Vt. Thus, the NROM memory cell has a larger operating capacity for multi-state storage.

To achieve these and other advantages and in accordance with the purpose of the invention, as embodied and broadly described herein, the invention provides a method of controlling a multi-state NROM. The NROM comprises of a substrate, a source terminal and a drain terminal in the substrate and a gate electrode. The gate electrode is located above the substrate between the source terminal and the drain terminal. The gate electrode is a multi-layered stack that includes, from bottom to top, a first oxide layer, a nitride layer, a second oxide layer and a polysilicon layer. The nitride layer can trap electric charges and hence can serve as a charge holder.

The method of controlling the multi-state NROM includes the following steps. First, a programming step is executed to inject electric charges into the nitride layer so that electric charges are trapped. The amount of electric charges trapped inside the nitride layer is precisely controlled so that the memory cell can have different threshold voltages. To read from the memory cell, a first variable voltage is applied to the gate electrode. According to the range of a second variable voltage applied to the drain terminal, three different potential levels, from the smallest to the largest, including a first potential level, a second potential level and a third potential level are set. The second input voltage is adjusted to the first potential level. When a high current is sensed, a first storage state is assumed. If little current is detected, the second input voltage is adjusted to the second potential level. When a high current is sensed, a second storage state is assumed. On the other hand, if little current is detected, the second input voltage is adjusted to the third potential level. Similarly, if a high current is sensed, a third storage state is assumed. Conversely, when little current is detected, a fourth storage state is assumed.

The difference between the first potential level and the second potential level and the difference between the second potential level and the third potential level can be identically set, for example, at 0.5V, 1.25V and 2V respectively. The first variable voltage can be set to a fixed voltage. On the other hand, if the first variable voltage is variable, the range of various read voltage regions (a total of three) of the drain terminal can be increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
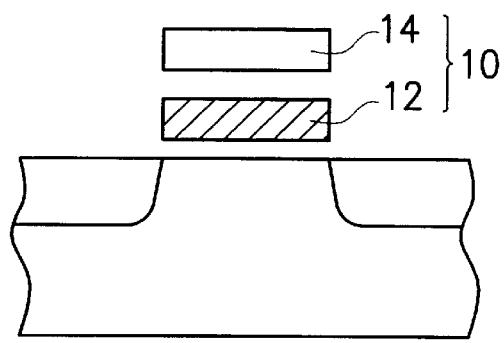
FIG. 1 is a schematic cross-sectional view of a conventional flash memory cell.
Figure 2:
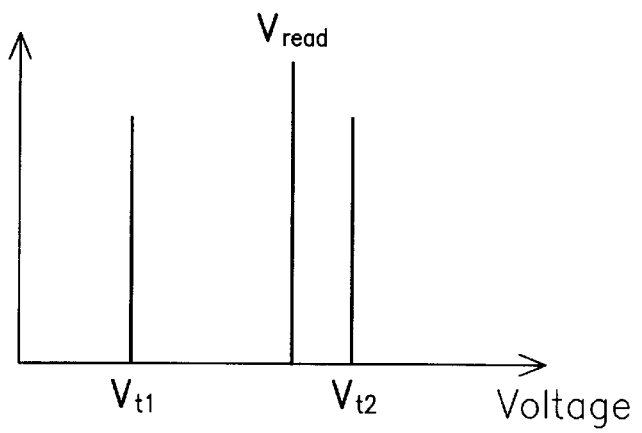
FIG. 2 is a simple graph showing the conventional method of distinguishing between logic '1' and '0' in a memory cell.
Figure 3:
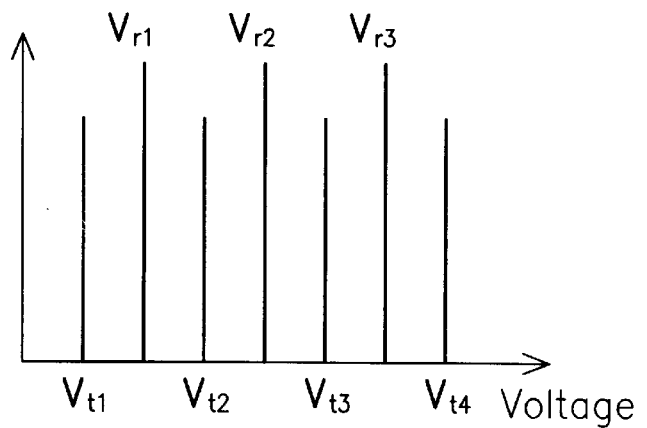
FIG. 3 is a graph showing a conventional method of distinguishing four different states in a memory cell (including '00', '01', '10' and '11')

Reference will now be made in detail to the present preferred embodiments of the invention, examples of which are illustrated in the accompanying drawings. Wherever possible, the same reference numbers are used in the drawings and the description to refer to the same or like parts.

Figure 4:
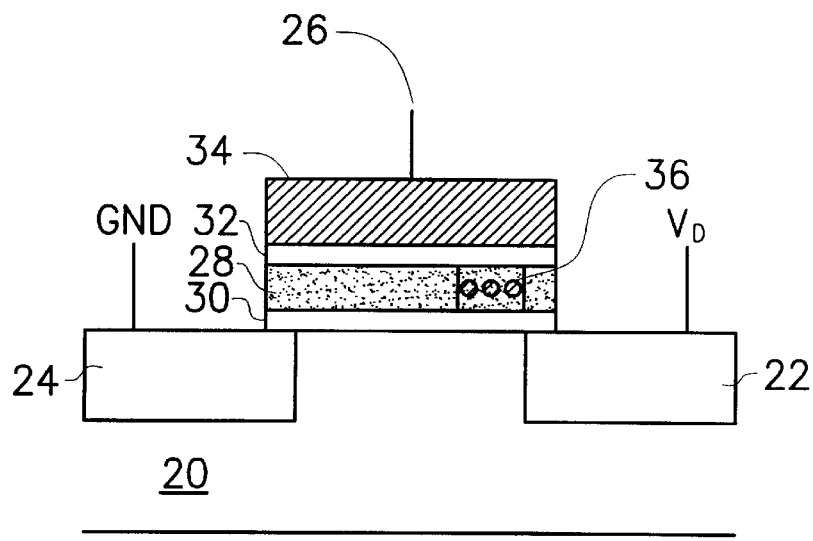
FIG. 4 is a schematic cross-sectional side view of an NROM.

FIG. 4 is a schematic cross-sectional side view of an NROM. As shown in FIG. 4, an NROM has several parts similar to a conventional MOS transistor. The NROM has a substrate 20 (for example, a P-type substrate), a drain terminal 22, a source terminal 24 in the substrate 20 and an $N^+$ ion region formed by an $N^+$ ion implantation. However, the NROM has gate electrode 26 above the substrate 20 between the drain terminal 22 that differs from a conventional MOS transistor. The gate electrode 26 is formed from a multi-layered stack that includes, from bottom to top, a first oxide layer 30, a nitride layer 28, a second oxide layer 32 and a polysilicon layer 34. If a high voltage is applied between the gate electrode 26 and the drain terminal 22, hot electrons will penetrate the first oxide layer 30. Ultimately, the hot electrons are trapped inside the nitride layer 28 to form a charge accumulation region 36.

Figure 5:
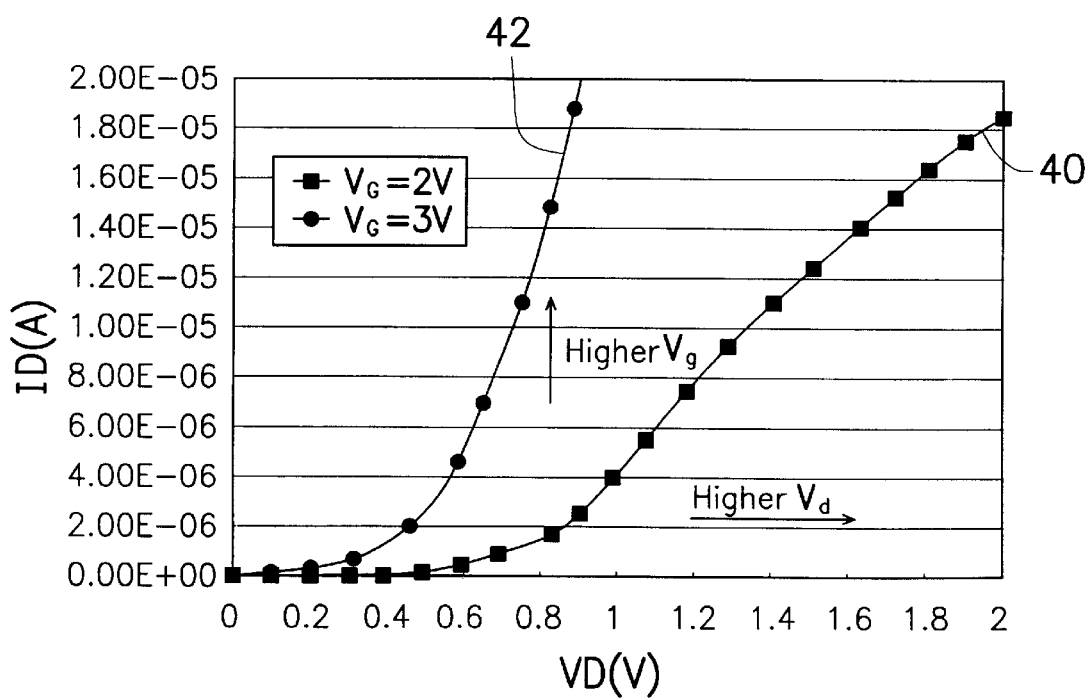
FIG. 5 is a graph showing the relationship of $I_D$ versus $V_D$ for an NROM.
Figure 6:
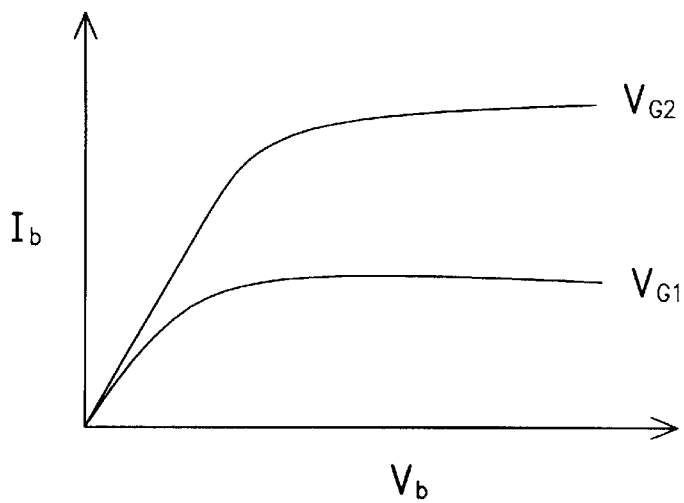
FIG. 6 is a graph showing the relationship of $I_D$ versus $V_D$ for a conventional MOS transistor.

FIG. 5 is a graph showing the relationship of $I_D$ versus $V_D$ for an NROM. The method of controlling the multi-state NROM is explained using FIG. 5. When the NROM memory cell is programmed to a high threshold voltage Vt, electric charges (slash line circles) are stored inside the charge accumulation region 36 (refer to FIG. 4) to form a locally pulled-high surface potential area (slash line portion). During forward read, the high voltage $V_D$ applied to the drain terminal 22 in FIG. 5 must be of such magnitude so that the depletion region (dash lines in FIG. 4) can exceed the high threshold voltage Vt region in the charge accumulation region 36 to generate a high current in the channel. In addition, the gate voltage $V_G$ can be varied to generate a specified $I_D$ versus $V_D$ curve such as the curves 40 and 42 for a gate voltage of 2V and 3V respectively. FIG. 6 is a graph showing the relationship of $I_D$ versus $V_D$ for a conventional MOS transistor. In FIG. 6, no matter what the value of $V_{G1}$ and $V_{G2}$ are, the transistor is saturated when the drain voltage $V_D$ reaches a definite level. Hence, there will not be a rapid change of current. In this invention, however, the method of controlling the multi-state NROM includes the utilization of a special local charge-trapping region. Furthermore, characteristics of the charge-trapping region can be controlled by the drain voltage $V_D$ and the gate voltage $V_G$ so that differently programmed threshold voltage Vt can be distinguished. Hence, the memory cell of this invention can be used to form a multi-level storage device.

Figure 7:
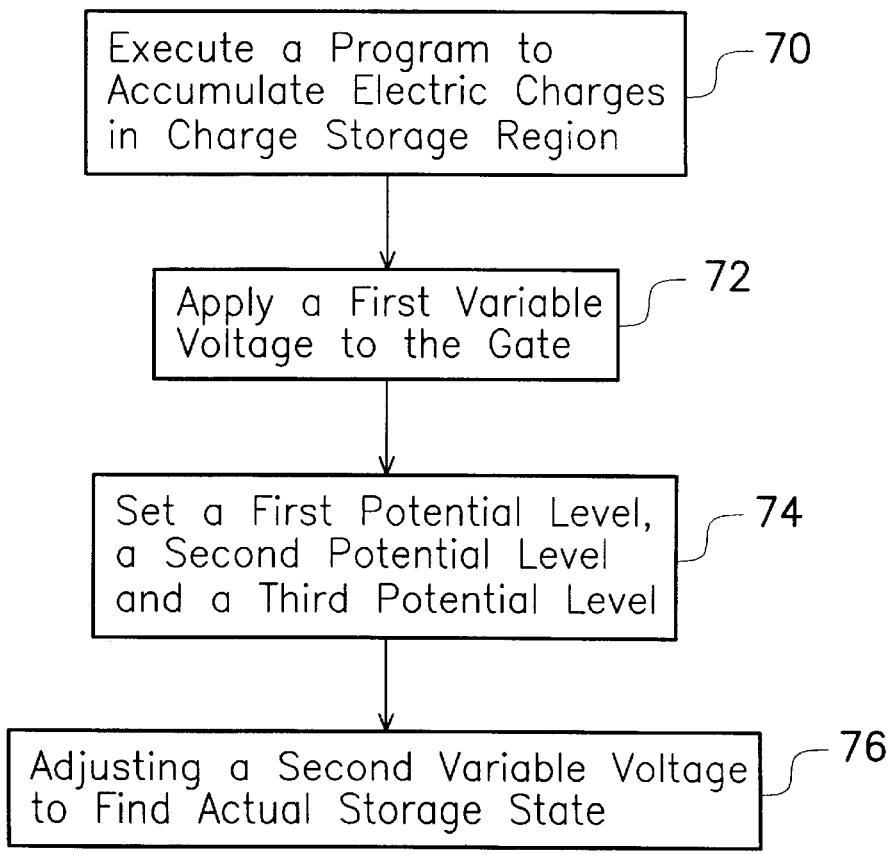
FIG. 7 is a flow chart showing the steps for controlling the multi-state NROM according to the method of this invention.
Figure 8:
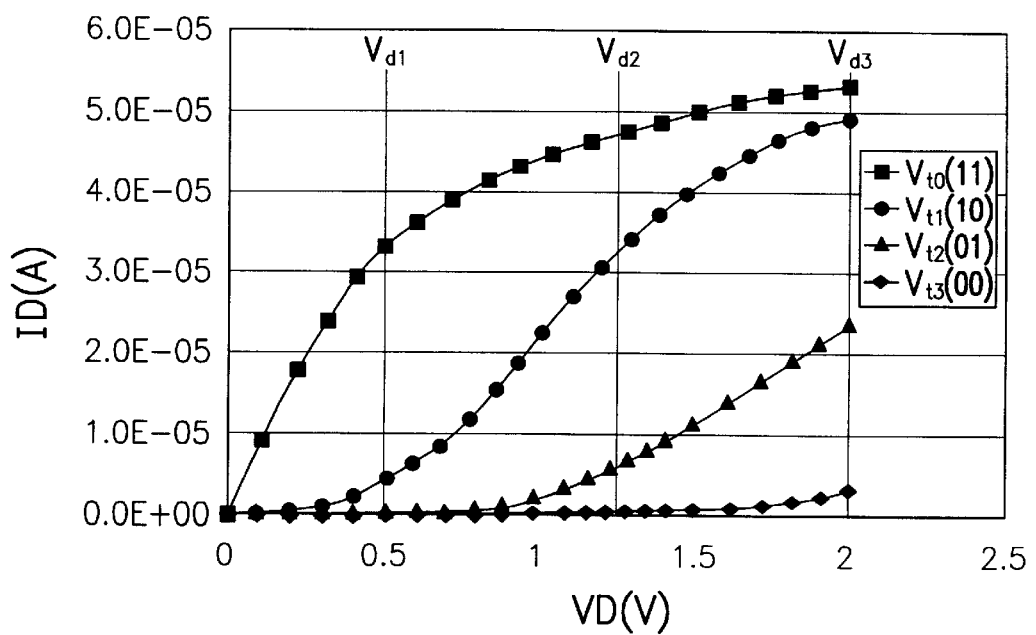
FIG. 8 is a graph showing the different programmed threshold voltages Vt for forward reading the NROM memory cell according to this invention.

FIG. 7 is a flow chart showing the steps for controlling the multi-state NROM according to the method of this invention. FIG. 8 is a graph showing the different programmed threshold voltages Vt for forward reading the NROM memory cell according to this invention. A programming operation is conducted in step 70 so that electric charges are stored inside the charge-trapping region. Since the amount of electric charges trapped inside the nitride layer is different, size of the threshold voltage are different (that means, a different threshold voltage Vt will result in a different characteristic curve). In step 72, a first variable voltage is applied to the gate electrode. In step 74, three different potential levels, from the smallest to the largest including a first potential level Vd1, a second potential level Vd2 and a third potential level Vd3 such as 0.5V, 1.25V and 2V as shown in FIG. 8, are set according to the range of a second variable voltage applied to the drain terminal. In step 76, the second variable voltage $V_D$ is adjusted. The second variable voltage $V_D$ is adjusted to the first potential level Vd1. If a high current (for example, $I_D$ set to a level greater than $3.0*10^{-5}$) is sensed, a first storage state (such as '00') is assumed. If no high current is detected, the second variable voltage $V_D$ is readjusted to the second potential level Vd2. If a high current is sensed, a second storage state (such as '01') is assumed. If no high current is sensed, the second variable voltage $V_D$ is readjusted to the third potential level Vd3. Similarly, if a high current is sensed, a third storage state is assumed. Otherwise, a fourth storage state is implied.

In this invention, the multi-state NROM operates in the forward reading direction only. Unlike a conventional method, reverse processing of the source terminal and the drain terminal is unnecessary while performing programming and reading. Hence, circuit complexity is reduced and second bit effect is avoided. In addition, since the trapped electric charges are mainly trapped close to the drain terminal region, scale down of the device is more probable.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of controlling a multi-state NROM having a substrate, a drain terminal and source terminal in the substrate, and a gate electrode above the substrate between the drain terminal and the source terminal, wherein the gate electrode is a multi-layered stack that includes, from bottom to top, a first oxide layer, a nitride layer, a second oxide layer and a polysilicon layer, and the nitride layer is able to trap a plurality of electric charges and hence can serve as a charge storage region, comprising the steps of:

performing a programming operation to inject electric charges and trap inside the nitride layer, and controlling the amount of stored inside the nitride layer so that the memory cell can have a plurality of different threshold voltages;

applying a first variable voltage to the gate electrode to initiate a reading step;

setting three different potential levels that includes, from the smallest to the largest, a first potential level, a second potential level and a third potential level according to the range of a second variable voltage applied to the drain terminal;

adjusting the second variable voltage to the first potential level, assuming a first storage state if a large current is sensed;

adjusting the second variable voltage to the second potential level if no large current is detected, assuming a second storage state if a large current is sensed after the adjustment; and adjusting the second variable voltage to the third potential level if no large current is detected, assuming a third storage state if a large current is sensed after the adjustment and assuming a fourth storage state if no large current is sense after the adjustment.

2. The method of claim 1, wherein the separation between the first potential level and the second potential level and the separation between the second potential level and the third potential level are identical.

3. The method of claim 2, wherein the first potential level, the second potential level and the third potential level are 0.5V, 1.25V and 2V respectively.

4. The method of claim 1, wherein the first variable voltage includes a fixed voltage.

* * * * *